(12) United States Patent
Yang et al.

(10) Patent No.: US 10,720,477 B2
(45) Date of Patent: Jul. 21, 2020

(54) OLED ARRAY SUBSTRATE, PRODUCTION METHOD THEREOF, AND DISPLAY APPARATUS

(71) Applicant: BOE Technology Group Co., Ltd., Beijing (CN)

(72) Inventors: Shengji Yang, Beijing (CN); Xue Dong, Beijing (CN); Xiaochuan Chen, Beijing (CN); Hui Wang, Beijing (CN); Yanming Wang, Beijing (CN); Fang Yu, Beijing (CN); Wei Li, Beijing (CN); Ming Yang, Beijing (CN); Pengcheng Lu, Beijing (CN); Nan Mu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/108,264

(22) Filed: Aug. 22, 2018

(65) Prior Publication Data

US 2019/0245013 A1   Aug. 8, 2019

(30) Foreign Application Priority Data

Feb. 8, 2018   (CN) .......................... 2018 1 0128256

(51) Int. Cl.
| | |
|---|---|
| H01L 27/32 | (2006.01) |
| H01L 51/50 | (2006.01) |
| H01L 51/56 | (2006.01) |
| H01L 51/52 | (2006.01) |
| G06F 3/041 | (2006.01) |
| G06F 3/044 | (2006.01) |

(52) U.S. Cl.
CPC ........ *H01L 27/3246* (2013.01); *G06F 3/0412* (2013.01); *G06F 3/0416* (2013.01); *G06F 3/0443* (2019.05); *H01L 27/323* (2013.01); *H01L 27/3276* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/56* (2013.01); *H01L 51/5237* (2013.01)

(58) Field of Classification Search
None
See application file for complete search history.

(56) References Cited

U.S. PATENT DOCUMENTS

| | | | |
|---|---|---|---|
| 2011/0043464 A1* | 2/2011 | Lee .................... | G06F 3/042 345/173 |
| 2017/0075452 A1* | 3/2017 | Kim ................... | G06F 3/0412 |
| 2019/0012022 A1* | 1/2019 | Ye ..................... | H01L 27/3258 |

FOREIGN PATENT DOCUMENTS

WO   WO-2019000520 A1 *   1/2019 ............. G06F 3/044

\* cited by examiner

*Primary Examiner* — Nishath Yasmeen
(74) *Attorney, Agent, or Firm* — Westman, Champlin & Koehler, P.A.

(57) ABSTRACT

There is provided an OLED array substrate, a production method thereof, and a display apparatus. This OLED array substrate comprises: a substrate; a plurality of pixel defining layers which are provided at intervals on the substrate; and a conductive structure which is at least partly located in at least one of the plurality of pixel defining layers.

15 Claims, 6 Drawing Sheets

OLED ARRAY SUBSTRATE, PRODUCTION METHOD THEREOF, AND DISPLAY APPARATUS

CROSS-REFERENCE TO RELATED APPLICATION

This application claims the benefit of priority of Chinese Application No. 201810128256.9 filed on Feb. 8, 2018, the entire contents of which are hereby incorporated by reference.

TECHNICAL FIELD

Embodiments of this disclosure relate to the technical field of display, and particularly to an OLED array substrate, a production method thereof, and a display apparatus.

BACKGROUND ART

Organic light-emitting diode (OLED) displays are one of hot spots in the research area of current flat panel displays. Compared to liquid crystal displays, OLED displays have the advantages of low energy consumption, low production cost, self light emission, wide view angle, high response speed, and the like. At present, in the area of display for cell phones, Personal Digital Assistants (PDA), digital cameras, and the like, OLEDs have begun to substitute for traditional LCDs. As the size of an OLED display increases, the requirements for the precision of touch control are also increasing.

SUMMARY

Embodiments of this disclosure provide an OLED array substrate, a production method thereof, and a display apparatus.

According to one aspect of this disclosure, there is provided an OLED array substrate, comprising: a substrate; a plurality of pixel defining layers which are provided at intervals on the substrate; and a conductive structure which is at least partly located in at least one of the plurality of pixel defining layers.

In an embodiment of this disclosure, the conductive structure comprises a first portion which extends through one of the plurality of pixel defining layers along a direction perpendicular to the substrate.

In an embodiment of this disclosure, the OLED array substrate further comprises: at least one material layer located on the plurality of pixel defining layers and a first electrode located on the at least one material layer, and the conductive structure further comprises a second portion which extends through the at least one material layer along a direction perpendicular to the substrate and is connected to the first electrode.

In an embodiment of this disclosure, the conductive structure further comprises a third portion which is located on a top surface of the plurality of pixel defining layers, the first portion is in contact with a bottom surface of the third portion, and the second portion is in contact with a top surface of the third portion.

In an embodiment of this disclosure, the OLED array substrate further comprises: an insulating layer which is located between the substrate and the plurality of pixel defining layers, wherein the conductive structure further comprises a fourth portion which is located between the insulating layer and the substrate and is in contact with the first portion.

In an embodiment of this disclosure, a size of the third portion along a direction parallel to the substrate is greater than those of the first portion and the second portion along a direction parallel to the substrate.

In an embodiment of this disclosure, the third portion covers an entire top surface of the at least one of the pixel defining layers.

In an embodiment of this disclosure, the OLED array substrate further comprises: an organic light-emitting device which is located between the plurality of pixel defining layers. The organic light-emitting device comprises: an anode located on the substrate; a hole injection/transport layer located on the anode; a light-emitting layer located on the hole injection/transport layer; an electron injection/transport layer located on the light-emitting layer; and a cathode located on the electron injection/transport layer. The at least one material layer comprises a first material layer and a second material layer located on the first material layer, the hole injection/transport layer and the first material layer are formed from an identical film layer, the electron injection/transport layer and the second material layer are formed from an identical film layer, and the cathode and the first electrode are formed from an identical film layer.

In an embodiment of this disclosure, the first electrode and the cathode are integrally formed to constitute an integrated electrode.

According to another aspect of this disclosure, there is provided a method of producing an OLED array substrate, comprising steps of: providing a substrate; forming a plurality of pixel defining layers, which are provided at intervals on the substrate, on the substrate; and forming a conductive structure which is at least partly located in at least one of the plurality of pixel defining layers.

In an embodiment of this disclosure, the step of forming a conductive structure comprises: patterning the at least one of the plurality of pixel defining layers to form a through hole; forming a first conductive layer which covers the substrate and the plurality of pixel defining layers; patterning the first conductive layer to form a first portion of the conductive structure located in the through hole, a third portion of the conductive structure located on a top surface of the plurality of pixel defining layers, and an anode of an organic light-emitting device located between the plurality of pixel defining layers.

In an embodiment of this disclosure, the method further comprises: forming at least one material layer which covers the plurality of pixel defining layers and the third portion; providing a conductive cone on the at least one material layer, wherein a vertical projection of the conductive cone on the substrate and a vertical projection of the third portion on the substrate are overlapped; allowing the conductive cone to penetrate the at least one material layer and to be in contact with the third portion; and forming a second conductive layer to cover the at least one material layer and the conductive cone, wherein the conductive cone constitutes a second portion of the conductive structure, and the second conductive layer is connected to the first portion via the second portion and the third portion.

In an embodiment of this disclosure, the method further comprises, before providing the conductive cone: forming a hole injection/transport layer of the organic light-emitting device on the anode and the plurality of pixel defining layers; forming a light-emitting layer of the organic light-emitting device on the hole injection/transport layer and between the plurality of pixel defining layers; and forming an electron injection/transport layer of the organic light-emitting device on the light-emitting layer and on the hole injection/transport layer on the plurality of pixel defining layers, wherein the at least one material layer comprises the hole injection/transport layer and the electron injection/transport layer on the plurality of pixel defining layers.

In an embodiment of this disclosure, a part of the second conductive layer located between the plurality of pixel defining layers is a cathode of the organic light-emitting device.

In an embodiment of this disclosure, the method further comprises, before forming the plurality of pixel defining layers: forming a fourth portion of the conductive structure on the substrate; and forming an insulating layer on the substrate and the fourth portion. The first portion of the conductive structure extends through the insulating layer to be in contact with the fourth portion.

According to yet another aspect of this disclosure, there is provided a display apparatus, comprising an OLED array substrate, the OLED array substrate comprising:
a substrate;
a plurality of pixel defining layers which are provided at intervals on the substrate; and
a conductive structure which is at least partly located in at least one of the plurality of pixel defining layers.

In an embodiment of this disclosure, the conductive structure comprises a first portion which extends through one of the plurality of pixel defining layers along a direction perpendicular to the substrate.

In an embodiment of this disclosure, the OLED array substrate further comprises at least one material layer located on the plurality of pixel defining layers and a first electrode located on the at least one material layer, and the conductive structure further comprises a second portion which extends through the at least one material layer along a direction perpendicular to the substrate and is connected to the first electrode.

In an embodiment of this disclosure, the conductive structure further comprises a third portion which is located on a top surface of the plurality of pixel defining layers, the first portion is in contact with a bottom surface of the third portion, and the second portion is in contact with a top surface of the third portion.

In an embodiment of this disclosure, the OLED array substrate further comprises an insulating layer which is located between the substrate and the plurality of pixel defining layers, wherein the conductive structure further comprises a fourth portion which is located between the insulating layer and the substrate and is in contact with the first portion.

In an embodiment of this disclosure, a size of the third portion along a direction parallel to the substrate is greater than those of the first portion and the second portion along a direction parallel to the substrate.

In an embodiment of this disclosure, the third portion covers an entire top surface of the at least one of the pixel defining layers.

In an embodiment of this disclosure, the OLED array substrate further comprises: an organic light-emitting device which is located between the plurality of pixel defining layers,
wherein the organic light-emitting device comprises:
an anode located on the substrate;
a hole injection/transport layer located on the anode;
a light-emitting layer located on the hole injection/transport layer;
an electron injection/transport layer located on the light-emitting layer; and
a cathode located on the electron injection/transport layer,
wherein the at least one material layer comprises a first material layer and a second material layer located on the first material layer, the hole injection/transport layer and the first material layer are formed from an identical film layer, the electron injection/transport layer and the second material layer are formed from an identical film layer, and the cathode and the first electrode are formed from an identical film layer.

In an embodiment of this disclosure, the first electrode and the cathode are integrally formed to constitute an integrated electrode.

Adaptable further aspects and scopes become conspicuous from the description provided herein. It is to be understood that respective aspects of this application may be implemented alone or in combination with one or more other aspects. It is also to be understood that the description and specific embodiments herein are only for the purpose of illustration and are not intended to limit the scope of this application.

DESCRIPTION OF DRAWINGS

The accompanying drawings described herein are only used for the purpose of illustration of selected embodiments, are not all possible embodiments, and are not intended to limit the scope of this application, in which.

Throughout respective views of these accompanying drawings, the corresponding reference numerals indicate the corresponding members or features.

DESCRIPTION OF EMBODIMENTS

It is to be first indicated that singular forms of the words used herein and the appended claims comprise plural forms, unless the context clearly dictates otherwise, vice versa. Therefore, when reference is made to a singular form of a term, a corresponding plural form of this term is typically encompassed. Similarly, the words "comprise" and "include" will be explained to be inclusive but not exclusive. Likewise, the terms "comprise" and "or" should be explained to be inclusive, unless otherwise specified herein. Where the term "example" is used herein, particularly where it lies behind a group of terms, said "example" is merely exemplary and illustrative, and should not be considered to be exclusive or extensive.

Furthermore, it is to be indicated that when an element and its embodiment of this application are introduced, the articles "a", "an", "the", and "said" are intended to indicate that there are one or more elements. Unless otherwise specified, "a plurality of" means two or two or more. The terms "comprise", "include", "contain", and "have" are intended to be inclusive and indicate that there may be additional elements other than the elements listed. Terms "first", "second", "third", and the like are for the purpose of description only, and cannot be understood as indicating or implying relative importance and the order of formation.

The flow chart depicted in this disclosure is merely an example. There may be many variations of this flow chart or steps described therein without departing from the spirit of this disclosure. For example, the steps may be performed in different orders, or steps may be added, deleted, or modified. These variations are considered to be a part of aspects sought to be protected.

Exemplary embodiments will now be more fully described with reference to accompanying drawings.

Figure 1:
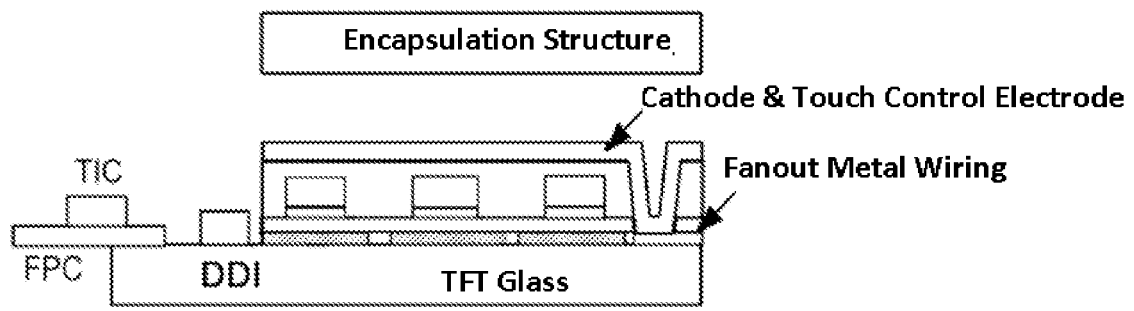
FIG. 1 is a schematic sectional view showing an OLED touch control module.

FIG. 1 shows a schematic sectional view of an OLED touch control module. As shown in FIG. 1, the OLED touch control module comprises an FPC (flexible printed circuit), a TIC (Touch Integrating Chip), a DDIC (Display Driving Integrating Chip), a TFT glass, an encapsulation structure, and a cathode & touch control electrode, which are assembled together. The cathode and the touch control electrode in FIG. 1 are integrated into the same layer to embed a touch control function in the interior of an OLED display panel. A wiring of the touch control electrode (i.e., cathode) is connected to a back panel of the substrate through a peripheral area (for example, a Fanout metal wiring) of the OLED display panel.

Figure 2:
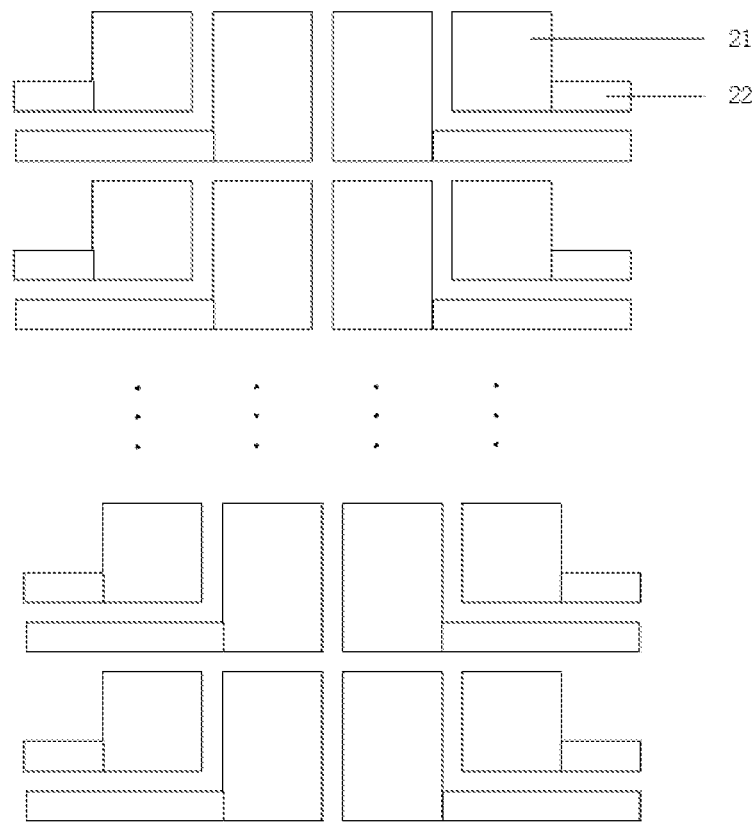
FIG. 2 is a schematic planar view showing a pattern of a touch control electrode.

FIG. 2 is a schematic planar view showing a pattern of the touch control electrode of the OLED touch control module as shown in FIG. 1. As shown in FIG. 2, the touch control electrode 21 (i.e., cathode 21) and the wiring 22 are both located in a display area, and the wiring therefore occupies an excessive available area, resulting in the occurrence of a blind area of located touch control.

Figure 3:
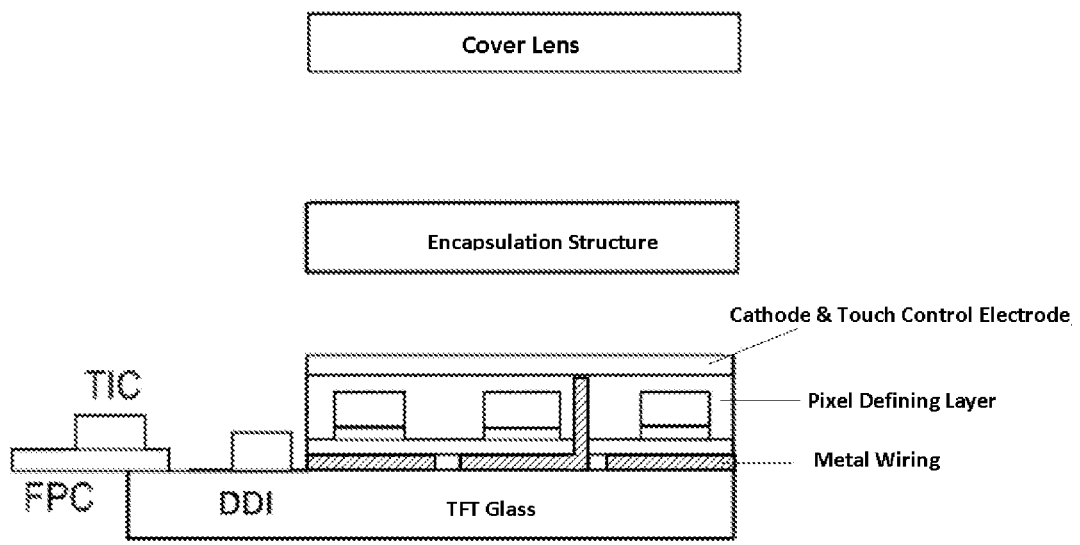
FIG. 3 is a schematic sectional view showing an OLED touch control module according to an embodiment of this disclosure.

FIG. 3 is a schematic sectional view showing an OLED touch control module according to an embodiment of this disclosure. As shown in FIG. 3, the OLED touch control module comprises an FPC (flexible printed circuit), a TIC (Touch Integrating Chip), a DDIC (Display Driving Integrating Chip), a TFT glass, an encapsulation structure, a cover lens, and a cathode & touch control electrode, which are assembled together. The touch control electrode (i.e., cathode) is connected to the back panel of the substrate through a wiring in the pixel defining layer. The OLED touch control module in an embodiment of this disclosure may be a type of mutual-capacitance touch control or self-capacitance touch control.

Figure 4:
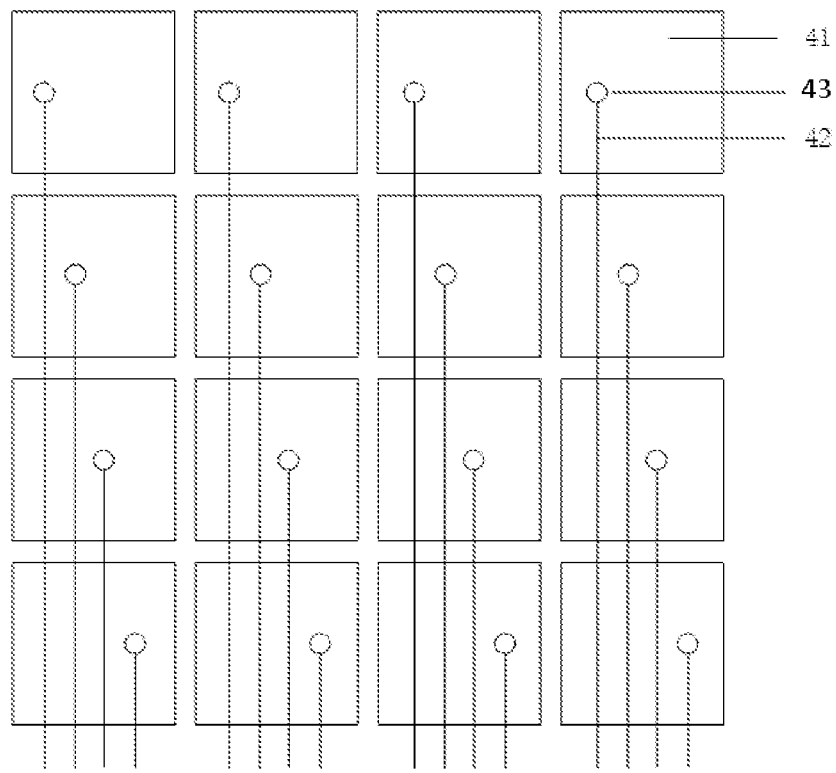
FIG. 4 is a schematic planar view of a pattern of a touch control electrode according to an embodiment of this disclosure.

FIG. 4 is a schematic planar view showing a pattern of the touch control electrode in the OLED touch control module as shown in FIG. 3. As shown in FIG. 4, a wiring 42 is connected to a touch control electrode 41 through a through hole 43, and is guided to a driving IC below the panel across the surface of the touch control electrode 41. Therefore, the wiring is designed to be in the interior of the display area to solve the problem of the blind area of touch control, so that a uniform design of the touch control electrode is ensured and in turn it is effective to improve the precision of touch control and reduce the effect of IR rising. Furthermore, the design described above may reduce the borders of the OLED display panel to the maximal extent, so that narrow borders are achieved while the design requirements for a full-in-cell touch control product having a size of a mobile phone are satisfied.

Figure 5:
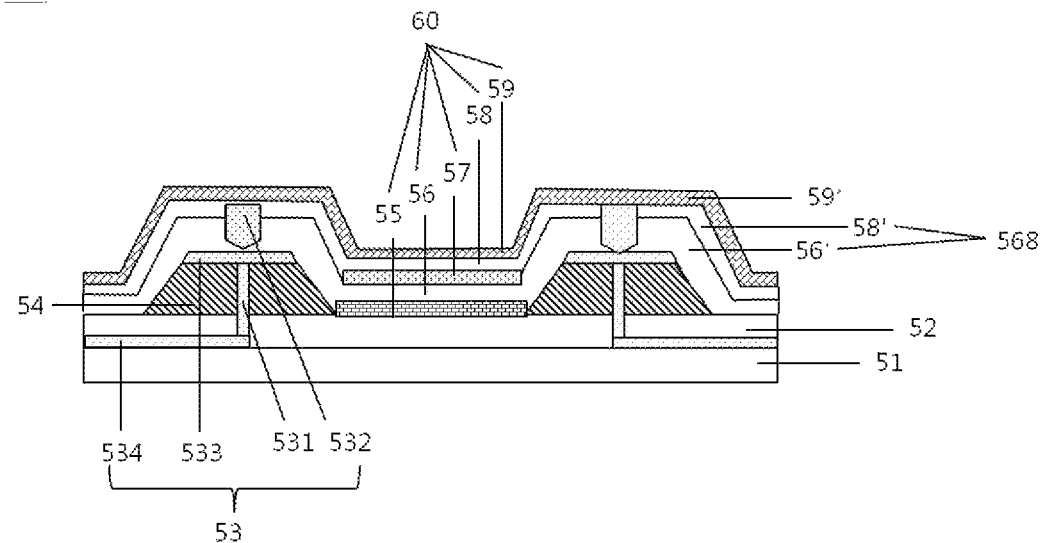
FIG. 5 is a schematic sectional view showing an OLED array substrate according to an embodiment of this disclosure.

FIG. 5 is a schematic sectional view showing an OLED array substrate according to an embodiment of this disclosure. As shown in FIG. 5, an OLED array substrate 500 comprises: a substrate 51; an insulating layer 52 located on the substrate 51; a plurality of pixel defining layers 54, which are provided at intervals on the insulating layer 52; a conductive structure 53, which is at least partly located in at least one of the plurality of pixel defining layers 54; and at least one material layer 568 located on the plurality of pixel defining layers 54 and a first electrode 59' located on the at least one material layer 568.

In an exemplary embodiment of this disclosure, the conductive structure 53 comprises: a first portion 531 which extends through one of the plurality of pixel defining layers 54 along a direction perpendicular to the substrate 51; a second portion 532 which extends through the at least one material layer 568 along a direction perpendicular to the substrate 51 and is connected to the first electrode 59'; a third portion 533 which is located on a top surface of the plurality of pixel defining layers 54; and a fourth portion 534 which is located between the insulating layer 52 and the substrate 51 and is in contact with the first portion 531.

In an exemplary embodiment of this disclosure, the first portion 531 is in contact with a bottom surface of the third portion 533, and the second portion 532 is in contact with a top surface of the third portion 533. A size of the third portion 533 along a direction parallel to the substrate 51 is greater than those of the first portion 531 and the second portion 532 along a direction parallel to the substrate, so that the first portion 531 is allowed to extend through the third portion 533 and the second portion 532 more easily and to be connected to the first electrode 59'. Optionally, the third portion 533 covers an entire top surface of the at least one of the pixel defining layers 54.

In an exemplary embodiment of this disclosure, an OLED array substrate 500 further comprises: an organic light-emitting device 60, which is located between the plurality of pixel defining layers 54. Specifically, the organic light-emitting device 60 comprises: an anode 55 located on the substrate 51; a hole injection/transport layer 56 located on the anode 55; a light-emitting layer 57 located on the hole injection/transport layer 56; an electron injection/transport layer 58 located on the light-emitting layer 57; and a cathode 59 located on the electron injection/transport layer 58.

In an exemplary embodiment of this disclosure, the at least one material layer 568 comprises a first material layer 56' and a second material layer 58' located on the first material layer 56'. It is to be noted that the hole injection/transport layer 56 and the first material layer 56' are formed from an identical film layer, the electron injection/transport layer 58 and the second material layer 58' are formed from an identical film layer, and the cathode 59 and the first electrode 59' are formed from an identical film layer.

In an exemplary embodiment of this disclosure, the first electrode 59' and the cathode 59 are integrally formed to constitute an integrated electrode. In a stage of display, the integrated electrode is used as a display electrode; and in a stage of touch control, the integrated electrode is used as a touch control electrode.

An embodiment of this disclosure further provides a display apparatus, comprising the above OLED array substrate according to an embodiment of this disclosure.

An embodiment of this disclosure further provides a method of producing an OLED array substrate so as to produce an OLED array substrate which ensures a uniform design of a touch control electrode and in turn effectively improves the precision of touch control.

Figure 6:
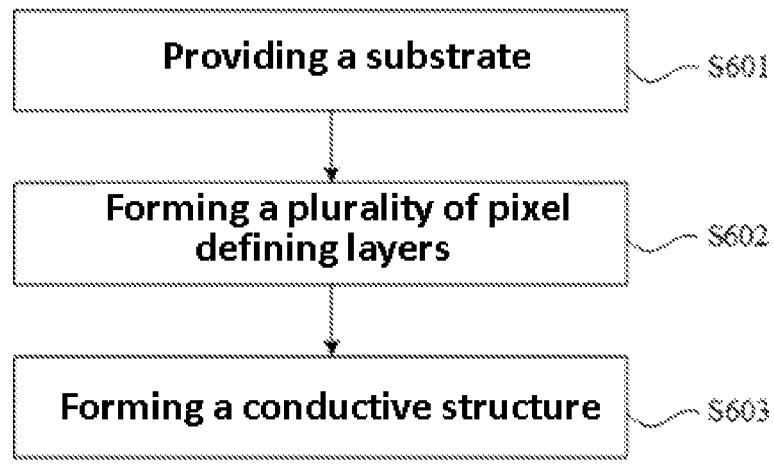
FIG. 6 is a flow chart showing a method of producing an OLED array substrate according to an embodiment of this disclosure.

FIG. 6 is a flow chart showing a method of producing an OLED array substrate according to an embodiment of this disclosure. FIG. 7a to FIG. 7g are schematic views showing a method of producing an OLED array substrate according to an embodiment of this disclosure.

As shown in FIG. 6, the method of producing an OLED array substrate comprises steps S601, S602, and S603. In step S601, a substrate is provided; in step S602, a plurality of pixel defining layers are formed; and in step S603, a conductive structure is formed. In an exemplary embodiment of this disclosure, the conductive structure 53 is at least partly located in at least one of the plurality of pixel defining layers 54.

Figure 7A:
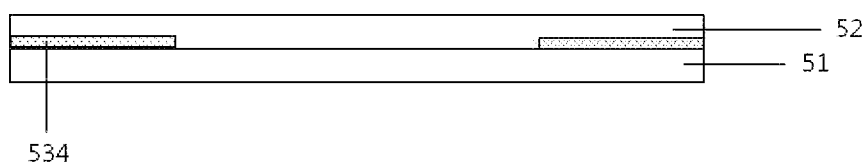
FIG. 7a to FIG. 7g are schematic views showing a method of producing an OLED array substrate according to an embodiment of this disclosure.

Specifically, as shown in FIG. 7a, a substrate 51 is provided; a fourth portion 534 of the conductive structure 53 is formed on the substrate 51; and an insulating layer 52 is formed on the substrate 51 and the fourth portion 534.

Figure 7B:
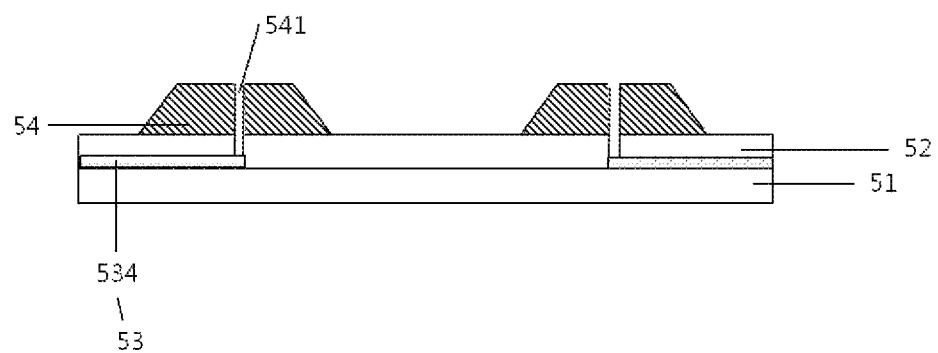

As shown in FIG. 7b, a plurality of pixel defining layers 54, which are provided at intervals, are formed on the insulating layer 52; and the at least one of the plurality of pixel defining layers 54 is patterned to form a through hole 541. The through hole 541 extends through the pixel defining layer 54 and the insulating layer 52 to expose the fourth portion 534.

Figure 7C:
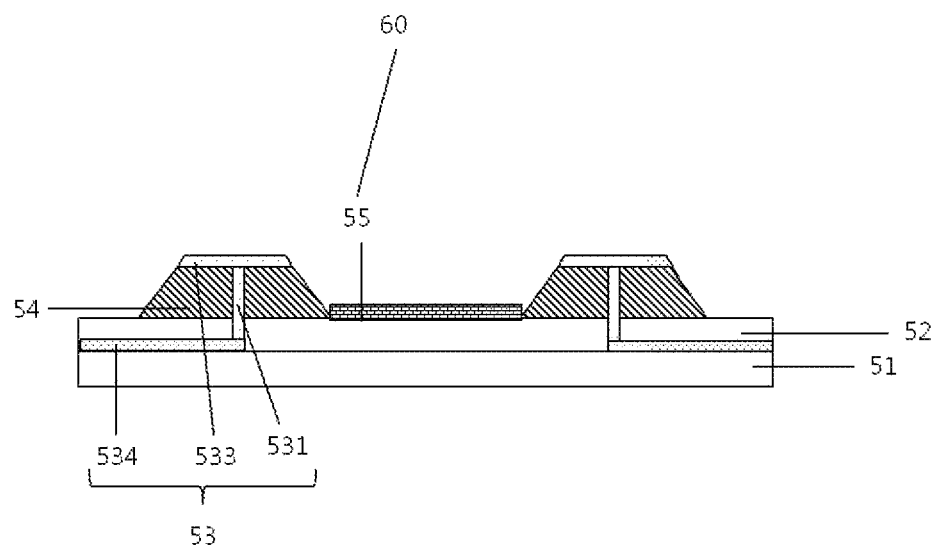

As shown in FIG. 7c, a first conductive layer, which covers the insulating layer 52 and the plurality of pixel defining layers 54, is formed; and the first conductive layer is patterned to form a first portion 531 of the conductive structure 53 located in the through hole 541 (see FIG. 7b), a third portion 533 of the conductive structure 53 located on a top surface of the plurality of pixel defining layers 54, and an anode 55 of an organic light-emitting device 60 located between the plurality of pixel defining layers 54. The first portion 531 of the conductive structure 53 extends through the insulating layer 52 to be in contact with the fourth portion 534.

Figure 7D:
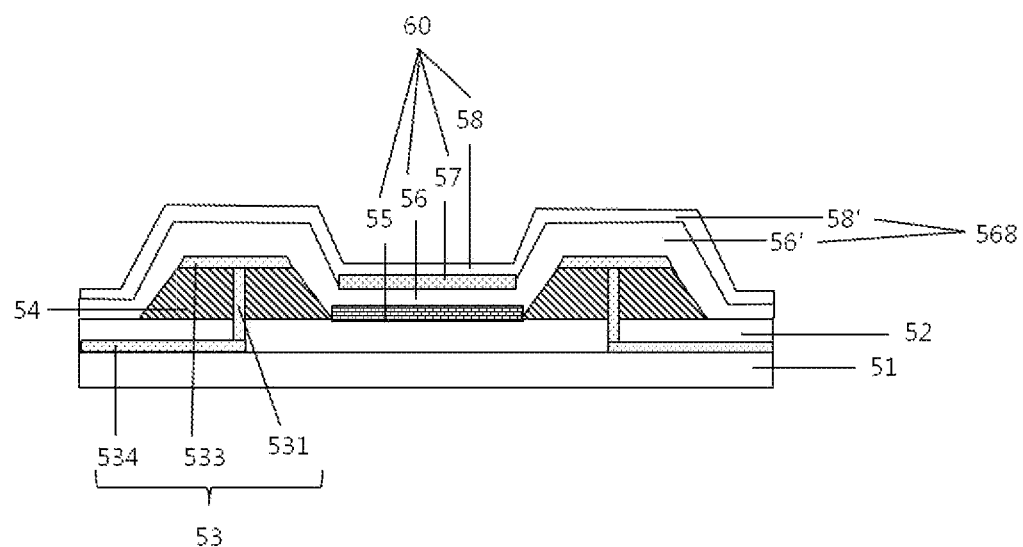

As shown in FIG. 7d, a hole injection/transport layer 56 of the organic light-emitting device 60 is formed on the anode 55 and the plurality of pixel defining layers 54; a light-emitting layer 57 of the organic light-emitting device 60 is formed on the hole injection/transport layer 56 and between the plurality of pixel defining layers 54; and an electron injection/transport layer 58 of the organic light-emitting device 60 is formed on the light-emitting layer 57 and on the hole injection/transport layer 56 on the plurality of pixel defining layers 54.

In an exemplary embodiment of this disclosure, the hole injection/transport layer 56 (also referred to as a first material layer 56') and the electron injection/transport layer 58 (also referred to as a second material layer 58'), which are located on the plurality of pixel defining layers 54, may be both collectively referred to as at least one material layer 568. The at least one material layer 568 covers the pixel defining layers 54 and the third portion 533.

Figure 7E:
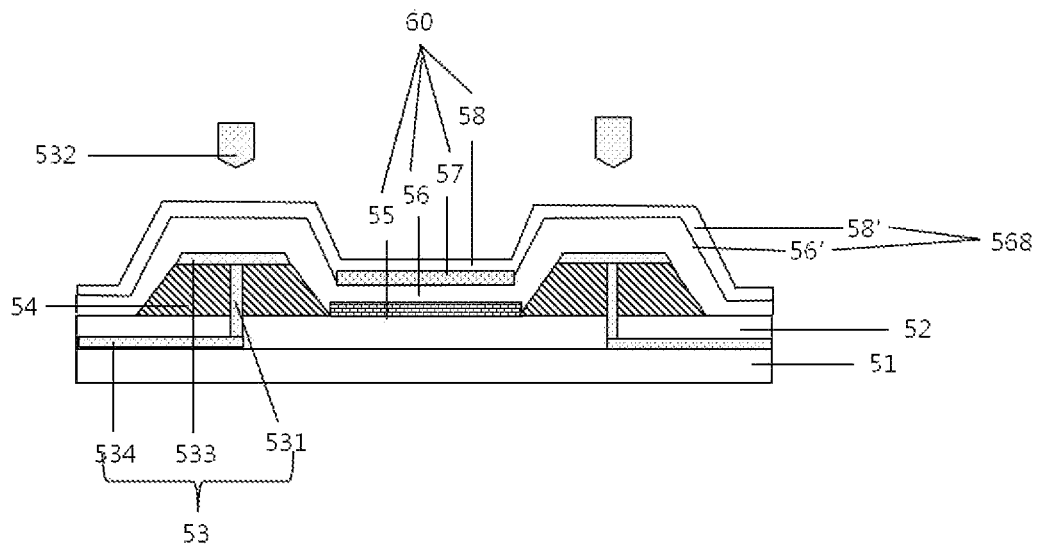
Figure 7F:
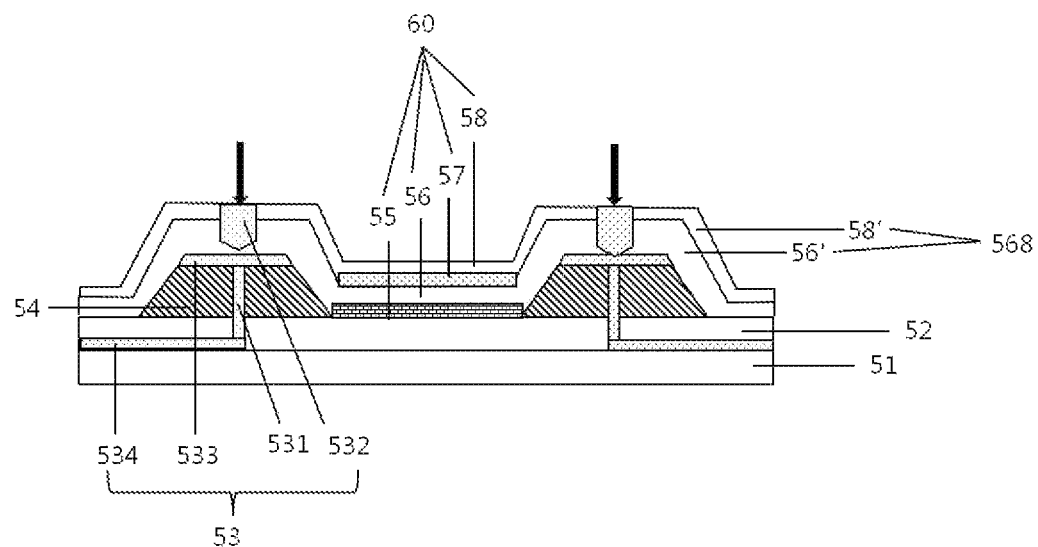
Figure 7G:
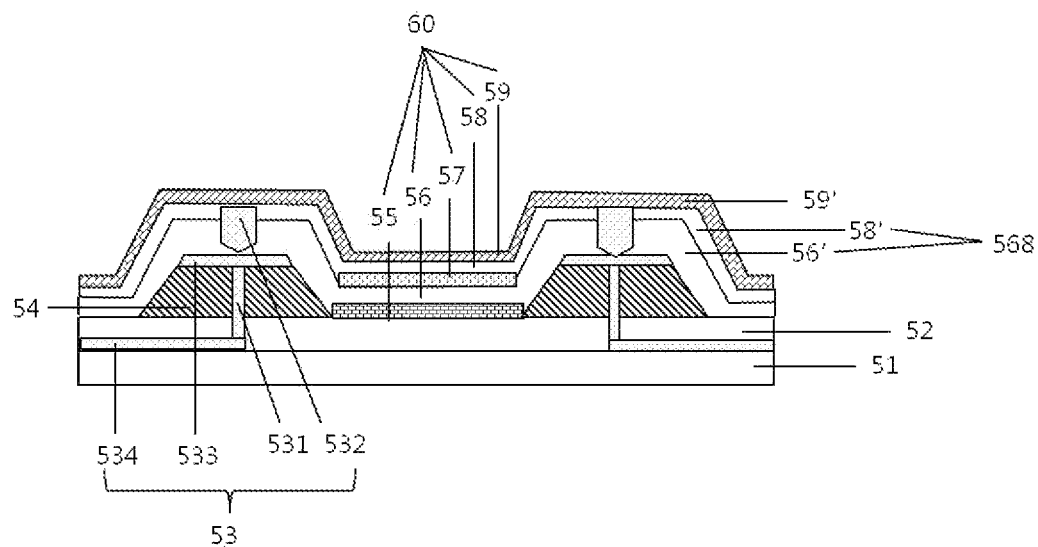

As shown in FIG. 7e, a conductive cone 532 is provided on the at least one material layer 568. A vertical projection of this conductive cone 532 on the substrate 51 and a vertical projection of the third portion 533 on the substrate 51 are overlapped. As shown in FIG. 7f, the conductive cone 532 is allowed to penetrate the at least one material layer 568 and to be in contact with the third portion 533. As shown in FIG. 7g, a second conductive layer 59' is formed to cover the at least one material layer 568 and the conductive cone 532. Furthermore, the conductive cone 532 constitutes the second portion 532 of the conductive structure 53. The second conductive layer 59' is connected to the first portion 531 via the second portion 532 and the third portion 533. In an embodiment of this disclosure, a physical connection is formed between the conductive cone 532 and the third portion 533 so as to be capable of reliably and effectively connect the second conductive layer 59' to the first portion 531.

In an exemplary embodiment of this disclosure, the second conductive layer 59' further comprises a part, which is a cathode 59 of the organic light-emitting device 60, located between the plurality of pixel defining layers 54. Specifically, the cathode 59 and the first electrode 59' are integrally formed to constitute an integrated electrode. In a stage of display, the integrated electrode is used as a display electrode; and in a stage of touch control, the integrated electrode is used as a touch control electrode.

An embodiment of this disclosure provides an OLED array substrate, a production method thereof, and a display apparatus, so that a uniform design of the touch control electrode can be ensured and in turn it is effective to improve the precision of touch control and reduce the effect of IR rising. Furthermore, the structure of this disclosure may reduce the borders of the OLED display panel to the maximal extent, so that narrow borders are achieved while the design requirements for a full-in-cell touch control product having a size of a mobile phone are satisfied.

The aforementioned description of embodiments is provided for the purpose of illustration and description, which are not intended to exhaust or limit this application. Respective elements or features of a specific embodiment are typically not limited to the specific embodiment. However, in a suitable case, these elements and features may be interchangeable and may be used in selected embodiments, even if not specifically shown or described. Likewise, modifications may also be made in many forms. These modifications should not be considered to depart from this application, and all of these modifications are comprised in the scope of this application.

What is claimed is:

1. An OLED array substrate, comprising:
   a substrate;
   a plurality of pixel defining layers which are provided at intervals on the substrate;
   at least one material layer located on a side of the plurality of pixel defining layers away from the substrate;
   a first electrode located on a side of the at least one material layer away from the plurality of pixel defining layers; and
   a conductive structure which is at least partly located in at least one of the plurality of pixel defining layers,
   wherein the conductive structure comprises:
   a first portion which extends through one of the plurality of pixel defining layers along a direction perpendicular to the substrate,
   a second portion comprising a conductive cone which is provided within the at least one material layer and extends through the at least one material layer along the direction perpendicular to the substrate, and
   a third portion which is located on a top surface of the plurality of pixel defining layers, sandwiched by the first portion and the second portion;
   wherein, the first portion is in direct contact with a bottom surface of the third portion, and wherein a bottom portion of the conductive cone is in direct contact with the first electrode, a side portion of the conductive cone is in direct contact with the at least one material layer and a point on a tip portion of the conductive cone is in direct contact with a top surface of the third portion, and the second portion and the first electrode are in different layers.

2. The OLED array substrate according to claim 1, further comprising an insulating layer which is located between the substrate and the plurality of pixel defining layers, wherein the conductive structure further comprises a fourth portion which is located between the insulating layer and the substrate and is in direct contact with the first portion.

3. The OLED array substrate according to claim 1, wherein a size of the third portion along a direction parallel to the substrate is greater than those of the first portion and the second portion along the direction parallel to the substrate.

4. The OLED array substrate according to claim 3, wherein the third portion covers an entire top surface of the at least one of the plurality of pixel defining layers.

5. The OLED array substrate according to claim 3, further comprising an organic light-emitting device which is located between the plurality of pixel defining layers,
wherein the organic light-emitting device comprises:
an anode located on the substrate;
a hole injection/transport layer located on the anode;
a light-emitting layer located on the hole injection/transport layer;
an electron injection/transport layer located on the light-emitting layer; and
a cathode located on the electron injection/transport layer,
wherein the at least one material layer comprises a first material layer and a second material layer located on the first material layer, the hole injection/transport layer and the first material layer are formed from an identical film layer, the electron injection/transport layer and the second material layer are formed from an identical film layer, and the cathode and the first electrode are formed from an identical film layer.

6. The OLED array substrate according to claim 5, wherein the first electrode and the cathode are integrally formed to constitute an integrated electrode.

7. A method of producing an OLED array substrate, comprising steps of:
providing a substrate;
forming a fourth portion of a conductive structure on the substrate;
forming an insulating layer on the substrate and the fourth portion;
forming a plurality of pixel defining layers, which are provided at intervals on the substrate
forming at least one material layer which covers the plurality of pixel defining layers and in direct contact with the plurality of pixel defining layers;
forming a first electrode on the at least one material layer;
providing a second portion of the conductive structure on the at least one material layer;
patterning the at least one of the plurality of pixel defining layers to form a through hole;
forming a first conductive layer which covers the substrate and the plurality of pixel defining layers;
patterning the first conductive layer to form a first portion of the conductive structure located in the through hole, which extends through one of the plurality of pixel defining layers along a direction perpendicular to the substrate; and a third portion of the conductive structure located on a top surface of the plurality of pixel defining layers, and an anode of an organic light-emitting device located between the plurality of pixel defining layers,
wherein the first portion is in direct contact with a bottom surface of the third portion, the second portion extends through the at least one material layer along the direction perpendicular to the substrate and is in direct contact with a top surface of the third portion, and the fourth portion is in direct contact with the first portion.

8. A display apparatus, comprising an OLED array substrate, the OLED array substrate comprising:
a substrate;
a plurality of pixel defining layers which are provided at intervals on the substrate;
at least one material layer located on a side of the plurality of pixel defining layers away from the substrate;
a first electrode located on a side of the at least one material layer away from the plurality of pixel defining layers; and
a conductive structure which is at least partly located in at least one of the plurality of pixel defining layers,
wherein the conductive structure comprises:
a first portion which extends through one of the plurality of pixel defining layers along a direction perpendicular to the substrate,
a second portion comprising a conductive cone which is provided within the at least one material layer and extends through the at least one material layer along the direction perpendicular to the substrate, and
a third portion which is located on a top surface of the plurality of pixel defining layers, sandwiched by the first portion and the second portion,
wherein, the first portion is in direct contact with a bottom surface of the third portion, and wherein a bottom portion of the conductive cone is in direct contact with the first electrode, a side portion of the conductive cone is in direct contact with the at least one material layer and a point on a tip portion of the conductive cone is in direct contact with a top surface of the third portion, and
the second portion and the first electrode are in different layers.

9. The display apparatus according to claim 8, wherein the OLED array substrate further comprises an insulating layer which is located between the substrate and the plurality of pixel defining layers, wherein the conductive structure further comprises a fourth portion which is located between the insulating layer and the substrate and is in direct contact with the first portion.

10. An OLED array substrate, comprising:
a substrate;
a plurality of pixel defining layers which are provided at intervals on the substrate;
at least one material layer which is located on the plurality of pixel defining layers and in direct contact with the plurality of pixel defining layers;
a first electrode located on the at least one material layer;
an insulating layer which is located between the substrate and the plurality of pixel defining layers; and
a conductive structure which is at least partly located in at least one of the plurality of pixel defining layers,
wherein the conductive structure comprises a first portion which extends through one of the plurality of pixel defining layers along a direction perpendicular to the substrate, a second portion which extends through the at least one material layer along the direction perpendicular to the substrate and is connected to the first electrode, a third portion which is located on a top surface of the plurality of pixel defining layers, and a fourth portion which is located between the insulating layer and the substrate, wherein the first portion is in direct contact with a bottom surface of the third portion, the second portion is in direct contact with a top surface of the third portion, and the fourth portion is in direct contact with the first portion.

11. The OLED array substrate according to claim 10, wherein the second portion comprises a conductive cone.

12. The OLED array substrate according to claim 11, wherein a bottom portion of the conductive cone is in direct contact with the first electrode, a side portion of the conductive cone is in direct contact with the at least one material layer and a point on a tip portion of the conductive cone is in direct contact with a top surface of the third portion.

13. The OLED array substrate according to claim 12, wherein in a cross section along a direction perpendicular to the substrate, the second portion has a first side for the most part perpendicular to the substrate, a second side opposite to the first side and for the most part perpendicular to the substrate, a third side meeting the first side, a fourth side meeting the second side, and a fifth side in direct contact with the first electrode, wherein the first side, the second side, the third side and the fourth side are provided within the at least one material layer, and the third side and the fourth side meet at a point which is in direct contact with a top surface of the third portion away from the substrate.

14. The OLED array substrate according to claim 10, wherein a size of the third portion along a direction parallel to the substrate is greater than those of the first portion and the second portion along the direction parallel to the substrate.

15. The OLED array substrate according to claim 14, wherein the third portion covers an entire top surface of the at least one of the plurality of pixel defining layers.

* * * * *